US 6,690,690 B2

(12) United States Patent
Marron

(10) Patent No.: US 6,690,690 B2
(45) Date of Patent: Feb. 10, 2004

(54) TUNABLE LASER SYSTEM HAVING AN ADJUSTABLE EXTERNAL CAVITY

(75) Inventor: Joseph C. Marron, Ann Arbor, MI (US)

(73) Assignee: LightGage, Inc., Bloomfield, NY (US)

( * ) Notice: Subject to any disclaimer, the term of this patent is extended or adjusted under 35 U.S.C. 154(b) by 0 days.

(21) Appl. No.: 10/446,012

(22) Filed: May 27, 2003

(65) Prior Publication Data

US 2003/0231691 A1 Dec. 18, 2003

Related U.S. Application Data

(60) Provisional application No. 60/392,960, filed on Jul. 1, 2002, and provisional application No. 60/384,058, filed on May 29, 2002.

(51) Int. Cl.[7] .............................. H01S 3/10; H01S 3/08
(52) U.S. Cl. ............................ 372/20; 372/98; 372/99; 372/107; 372/108
(58) Field of Search ........................ 372/20, 98, 99, 372/102, 107, 108, 29.022

(56) References Cited

U.S. PATENT DOCUMENTS

| | | | | |
|---|---|---|---|---|
| 3,653,384 A | * | 4/1972 | Swope | 372/107 |
| 3,774,121 A | * | 11/1973 | Ashkin et al. | 372/20 |
| 4,674,097 A | * | 6/1987 | Fountain | 372/107 |
| 4,832,489 A | | 5/1989 | Wyant et al. | 356/359 |
| 5,023,886 A | * | 6/1991 | Hobart et al. | 372/99 |
| 5,144,638 A | * | 9/1992 | Davin | 372/107 |
| 5,319,668 A | | 6/1994 | Luecke | 372/107 |
| 5,325,378 A | * | 6/1994 | Zorabedian | 372/20 |
| 5,627,363 A | | 5/1997 | Paxman et al. | 350/208.1 |
| 5,777,742 A | | 7/1998 | Marron | 356/359 |
| 5,802,085 A | | 9/1998 | Lefevre et al. | 372/20 |
| 5,867,512 A | | 2/1999 | Sacher | 372/20 |
| 5,880,841 A | | 3/1999 | Marron et al. | 356/360 |
| 5,907,404 A | | 5/1999 | Marron et al. | 356/360 |
| 5,909,282 A | | 6/1999 | Kulawiec | 356/355 |
| 5,926,277 A | | 7/1999 | Marron et al. | 356/360 |
| 5,995,521 A | * | 11/1999 | Moore et al. | 372/20 |
| 6,018,535 A | | 1/2000 | Maeda | 372/20 |
| 6,026,100 A | | 2/2000 | Maeda | 372/20 |
| 6,330,253 B1 | * | 12/2001 | Tuganov et al. | 372/107 |
| 6,359,692 B1 | | 3/2002 | Groot | 356/512 |
| 6,493,374 B1 | * | 12/2002 | Fomenkov et al. | 372/99 |
| 2001/0026574 A1 | * | 10/2001 | Yagi | 372/107 |
| 2002/0109851 A1 | | 8/2002 | Deck | 356/512 |

OTHER PUBLICATIONS

"Multiple-wavelength Interferometry with Tunable Source", R. G. Piston and G. N. Steinberg, Applied Optics, vol. 8, No. 3, Mar. 1969, pp. 552–556.

"Two-wavelength Interferometry", D. Malarcara, editor, Optical Shop Testing, New York, Wiley, 1978, pp. 397–402.

(List continued on next page.)

Primary Examiner—Paul Ip
Assistant Examiner—James Menefee
(74) Attorney, Agent, or Firm—Brian B. Shaw, Esq.; Thomas B. Ryan; Harter, Secrest & Emery LLP

(57) ABSTRACT

A wavelength tuning system adjusts an external cavity of a laser about two orthogonal axes for aligning features of a diffractive optic with a third orthogonal axis about which the diffractive optic is pivoted for providing selected wavelength feedback to the laser. A laser mount supports the laser, and a mounting arm supports both the diffractive optic and a reflective optic in a fixed orientation with respect to each other. A flexural member forms at least part of a connection between the mounting arm and the laser mount in a relative orientation for optically coupling the diffractive optic to the laser within the external cavity. The mounting arm is pivoted with respect to the laser mount about the pivot axis by an actuator for varying a wavelength of a diffracted portion of the output beam returned to the laser without significantly varying an angular orientation of the output beam with respect to the laser mount as reflected from the reflective optic.

57 Claims, 4 Drawing Sheets

OTHER PUBLICATIONS

"Multiple-wavelength Phase-shifting Interferometry", Y. Cheng and J. C. Wyant, Applied Optics, vol. 24, No. 6, Mar. 15, 1985, pp. 804–806.

"Distance measurement by the wavelength shift of laser diode light", H. Kikuta, K. Iwata, and R. Nagata, Applied Optics, vol. 25, No. 17, Sep. 1, 1986, pp. 2976–2980.

"Inferometer for measuring displacement and distance", T. Kubota, M. Nara, and T. Yoshino, Optics Letters, vol. 12, No. 5, May 1987, pp. 310–312.

"Three-color laser-diode interferometer", P. de Groot, Applied Optics, vol. 30, No. 25, Sep. 1, 1991, pp. 3612–3616.

"Wavelength-shift interferometry for distance measurements using the Fourier transform technique for fringe analysis", M. Suematsu and M. Takeda, Applied Optics, vol. 30, No. 28, Oct. 1, 1991, pp. 4046–4055.

"Three-dimensional lensless imaging using laser frequency diversity", J. C. Marron and K. S. Schroeder, Applied Optics, vol. 31, No. 2, Jan. 10, 1992, pp. 255–262.

"Holographic laser radar", J. C. Marron and K. S. Schroeder, Optics Letters, vol. 18, No. 5, Mar. 1, 1993, pp. 385–387.

"Use of a opacity constraint in three-dimensional imaging", R. G. Paxman, J. H. Seldin, J. R. Fienup, and J. C. Marron, in proceedings of the SPIE Conference on Inverse Optics III, Orlando, Florida, Apr. 1994.

"Applications of Tunable Lasers to Laser Radar and 3D Imaging", L. G. Shirley and G. R. Hallerman. Technical Report 1025, Licoln Laboratory, MIT, Lexington, Massachusetts, Feb. 26, 1996.

"Wavelength scanning profilometry for real-time surface shape measurement", S. Kuwamura and I. Yamaguchi, Applied Optics, vol. 36, No. 19, Jul. 1, 1997, pp. 4473–4482.

"Three-dimensional imaging using a tunable laser source", J. C. Marron and K. W. Gleichman, Optical Engineering 39(1) 47–51, Jan. 2000, pp. 47–51.

"Spectrally narrow pulsed dye laser without beam expander", M. G. Littman and H. J. Metcalf, Applied Optics: vol. 17, No. 14, Jul. 15, 1978, pp. 2224–2227.

"A simple extended-cavity diode laser", A. S. Arnold, J. S. Wilson, and M. G. Boshier, Review of Scientific Instruments, vol. 69, No. 3, Mar. 1998, pp. 1236–1239.

"External-cavity diode laser using a grazing-incidence diffraction grating", K. C. Harvey and C. J. Myatt, Optics Letters, vol. 16, No. 12, Jun. 15, 1991, pp. 910–912.

"Novel geometry for single-mode scanning of tunable lasers", K Liu and M. G. Littman, Optics Letters, vol. 6, No. 3, Mar. 1981, pp. 117–118.

"External-cavity frequency-stabilization of visible and infrared semiconductor lasers for high resolution spectroscopy", M. G. Boshier, D. Berkeland, E. A. Hinds, and V. Sandoghar, Optics Communications 85, Sep. 15, 1991, pp. 355–359.

"Widely Tunable External Cavity Diode Lasers", T. Day, M. Brownell, and I-Fan Wu, New Focus, Inc., 1275 Reamwood Avenue, Sunnydale, California (no date).

"Littrow configuration tunable external cavity diode laser with fixed direction output beam", C. J. Hawthorn, K. P. Weber and R. E. Scholten, Review of Scientific Instruments, vol. 72, No. 12, Dec. 2001, pp. 4477–4479.

"Fizeau Interferometer", D. Malarcara, editor, *Optical Shop Testing*, New York, Wiley, 1978, pp. 19–24.

"Burch's Interferometer Employing Two Matched Scatter Plates", D. Malarcara, editor, *Optical Shop Testing*, New York, Wiley, 1978, pp. 82–84.

"Holographic contouring by using tunable lasers", N. George and W. Li, Optics Letters, vol. 19, No. 22, Nov. 15, 1994, pp. 1879–1881.

"Use of a miltimode short-external-cavity laser diode for absolute-distance intereometry", P. de Groot, Applied Optics, vol. 32, No. 22, Aug. 1, 1993, pp. 4193–4198.

"Three-dimensional sensing of rough surfaces by coherence radar", T. Dresel, G. Hausler, and H. Venzke, Applied Optics, vol. 31, No. 7, Mar. 1, 1992, pp. 919–925.

Littrow-Laser web site sacher.de/littrow.htm, Apr. 7, 2002.

"Tunable Diode Lasers—Stand up to Research and Commercial Applications", B. Shine, Laser Product Line Manager, New Focus, Inc., originally published in Photonics Spectra, Jan. 1992, p. 102.

"Scatter Fringes of Equal Thickness", J. M. Burch, Nature, vol. 17, May 16, 1953, pp. 889–890.

"Scatter-Fringe Interferometry", J. M. Burch, J. Opt. Soc. Am. 52, 1962, pp. 600.

"Some Further Aspects of Scatter-Fringe Interferometry", A. H. Shoemaker and M.V.R.K. Murty, Applied Optics, vol. 5, No. 4, Apr. 1966, pp. 603–607.

"Laser Speckle and Related Phenomena", J. C. Dainty, editor, Springer-Verlag, Berlin, 1984.

"Digital Picture Processing", A. Rosenfeld, and A. C. Kak, vol. 1, Academic Press. New York, 1982.

* cited by examiner

TUNABLE LASER SYSTEM HAVING AN ADJUSTABLE EXTERNAL CAVITY

RELATED APPLICATIONS

This application claims the benefit of prior filed U.S. Provisional Application 60/384,058, filed May 29, 2002, and U.S. Provisional Application 60/392,960, filed Jul. 1, 2002. Both Provisional Applications are hereby incorporated by reference.

TECHNICAL FIELD

The invention relates to tunable laser systems, particularly of the type having adjustable external cavities for varying the wavelength of laser output beams. One end of such cavities is formed by diffractive optics that are inclined to the laser beams under the control of adjustment mechanisms to provide controlled wavelength feedback.

BACKGROUND

External cavity lasers are well known in the art. The external cavity returns a portion of the radiation generated by the laser back into a primary laser cavity as a form of optical feedback that alters the laser radiation being amplified in the primary laser cavity. Modifications can be made to the external cavity to control properties of the light amplified in the primary laser cavity. This procedure has been used for several years to stabilize and tune the frequency output of dye lasers and is described in *Spectrally Narrow Pulsed Dye Laser Without Beam Expander, Applied Optics*, Vol. 17, No. 14, Jul. 15, 1978. External cavities are also commonly used with diode lasers and can be used to create narrowband, wavelength tunable diode laser systems for such applications as telecommunications, spectroscopy, and metrology.

A primary laser has a defined output beam direction and lasing wavelength. The lasing wavelength, which is the wavelength that exhibits maximum gain, is set by properties of the laser gain medium and the laser cavity. While it is possible for the primary laser to operate at any of a range of wavelengths, a single wavelength can be favored by prevailing conditions for which gain is maximized.

The external cavity allows for the alteration of the lasing wavelength of the primary laser by providing feedback to the laser in the form of a selected wavelength other than the one initially favored by the primary laser. In this manner, the primary laser is artificially caused to favor another wavelength, thus creating a means to tune the wavelength of the laser system.

Two types of external laser cavities are commonly used—the Littman cavity and the Littrow cavity. Specific configurations of Littman cavities have been the subject of U.S. Pat. Nos. 5,319,668; 5,802,085; and 5,867,512. An article in the March 1998 Review of Scientific Instruments, Volume 69, Number 3, pages 1236–1239, by Arnold et al. entitled "A Simple Extended-cavity Diode Laser" describes an exemplary Littrow cavity configuration. These patents and the above referenced articles are incorporated by reference.

Although both the Littman cavity and Littrow cavity configurations provide effective wavelength tuning, the Littrow cavity configuration is preferred for many commercial applications because it has a lower component cost. According to the Littrow configuration, a collimated output beam from the primary laser is directed toward a reflective diffraction grating that is oriented so that a first diffracted order of the output beam is returned to the primary laser on a path of retroreflection. The wavelength of the first diffracted order provides feedback to the laser to influence the lasing wavelength. The zero diffracted order of the output beam reflects from the grating for exiting the external cavity.

For returning a particular wavelength "$\lambda$", a Littrow orientation angle "$\phi_{pitch}$" of the grating normal with respect to the beam direction of the primary laser is given by $$\phi_{pitch} = \sin^{-1}\left(\frac{\lambda}{2d}\right)$$

where "d" is the grating period. The external cavity thus provides feedback at wavelength "$\lambda$"; and if this feedback is such that "$\lambda$" becomes the wavelength for which the primary laser has maximum gain, then the laser system will lase at the feedback wavelength "$\lambda$".

A difficulty with the Littrow configuration, as shown in FIG. 1, is that the orientation of an output beam 18 from the external cavity 16 varies as the pitch angle $\phi_{pitch}$ of the diffraction grating 14 is changed. Thus, as the output beam 18 is tuned to different wavelengths, the orientation of the output beam changes, which produces significant alignment problems for optical devices intended for operation over multiple wavelengths.

SUMMARY OF THE INVENTION

The invention contemplates a wavelength tuning system for adjusting the external cavity of lasers and is intended to be particularly effective for varying output beam wavelength while maintaining the output beam from the external cavity at a fixed angular orientation. Improvements are made to the adjustment and alignment of components as well as to the components themselves, resulting in a robust structure that is easy to align and to maintain in alignment. The invention is especially useful for providing a tunable external cavity laser that operates optimally for various applications, such as multi-wavelength interferometry.

An exemplary wavelength tuning system for adjusting the external cavity of a laser in accordance with the invention includes a laser mount for supporting the laser that emits a wavelength-tunable output beam from the external cavity. A mounting arm supports both a diffractive optic and a reflective optic in a fixed orientation with respect to each other. A flexural member forms at least part of a connection between the mounting arm and the laser mount in a relative orientation that optically couples the diffractive optic to the laser within the external cavity. An actuator pivots the mounting arm with respect to the laser mount about a pivot axis for varying a wavelength of a diffracted portion of the output beam returned to the laser without significantly varying an angular orientation of the output beam with respect to the laser mount as reflected from the reflective optic. The flexural member supports a limited rotation of the mounting arm with respect to the laser mount about the pivot axis while providing resistance to a similar limited rotation of the mounting arm with respect to the laser mount about an orthogonal rotational axis.

Preferably, the tuning system also includes an adjuster to adjust the relative angular orientation of the mounting arm with respect to the laser mount about the orthogonal rotational axis. One such adjuster provides an adjustable mounting for the flexural member that adjusts the mounting of the flexural member between the mounting arm and the laser mount about the orthogonal rotational axis.

The orthogonal rotational axis is preferably a first of two orthogonal rotational axes that are orthogonal to the pivot axis, and the adjuster is preferably a first of two adjusters that adjust the relative angular orientation of the mounting arm with respect to the laser mount. A second of the adjusters can be used to adjust the relative angular orientation of the mounting arm with respect to the laser mount about the second of the orthogonal rotational axes. For example, the second adjuster can provide an adjustment of the flexural member between the mounting arm and the laser mount about the second orthogonal rotational axis. Similar adjustments can be made between two portions of the mounting arm, a first portion being connected to the flexural member and a second portion supporting both the diffractive optic and the reflective optic.

Alternatively, the second adjuster could engage the mounting arm remote from the flexural member for imparting a limited angular adjustment of the mounting arm about the second orthogonal rotational axis with respect to the laser mount through the flexural member. The mounting arm of this alternative preferably includes first and second ends—the first end being connected to the flexural member and a second end being connected to the second adjuster. The second adjuster permits motion of the mounting arm about the pivot axis while restricting further motion about the second orthogonal rotational axis from an established adjustment position. The flexural member preferably exerts a first preload torque on the mounting arm about the pivot axis for imparting a preload force on the actuator and preferably exerts a second preload torque on the mounting arm about the second orthogonal rotational axis for imparting a preload force on the second adjuster.

The first and second adjusters provide for adjusting the diffractive optic to return the diffracted portion of the output beam to the laser along a path of retroreflection. The diffractive optic preferably has a planar surface with rulings, and the first and second adjusters provide for relatively adjusting the rulings substantially parallel to the pivot axis. In this regard, the first adjuster preferably provides for relatively adjusting the rulings about the first orthogonal rotational axis in an orientation extending substantially perpendicular to the rulings, and the second adjuster provides for relatively adjusting the rulings about the second orthogonal rotational axis in an orientation extending substantially normal to the planar surface of the diffractive optic.

For defining the pivot axis, the flexural member is preferably mounted between nominally parallel mounting surfaces of the mounting arm and the laser mount. The pivot axis extends parallel to the nominally parallel mounting surfaces of the mounting arm and the laser mount. However, the first adjuster can provide for making small angular adjustments between the nominally parallel mounting surfaces of the mounting arm and the laser mount about the first orthogonal axis to better align the rulings of the diffractive optic substantially parallel to the pivot axis.

The flexural member in its preferred form has a plate-shaped body, and the pivot axis is defined by the bending of the plate-shaped body. For exerting the desired preload torques, the plate-shaped body of the flexural member is preferably made of a resilient material. A first fastening system preferably connects the plate-shaped body of the flexural member to the laser mount, and a second fastening system preferably connects the plate-shaped body of the flexural member to the mounting arm. One of these first and second fastening systems is preferably adjustable for adjusting the relative angular orientation of the mounting arm with respect to the laser mount about the first orthogonal rotational axis. The pivot axis extends substantially parallel to a plane of the plate-shaped body of the flexural member, and the first orthogonal rotational axis extends normal to the plane of the plate-shaped body of the flexural member.

An adjustable external cavity arrangement for a wavelength tunable laser according to the invention includes a laser mount for supporting the wavelength tunable laser, which emits an output beam whose peak wavelength is adjustable by wavelength feedback within the external cavity. A mounting arm supports both a diffractive optic and a reflective optic for movement with the mounting arm. A pivot supports relative rotation between the laser mount and the mounting arm for orienting the diffractive optic with respect to the laser through a range of pitch angles. The diffractive optic is movable with respect to the laser through the range of pitch angles for providing feedback to the laser as a corresponding range of wavelengths. The reflective optic is movable together with the diffractive optic for maintaining a substantially fixed angular orientation of the output beam with respect to the laser mount as reflected from the reflective optic. The diffractive optic and the reflective optic have front and back surfaces—the front surface of the diffractive optic being an operative surface for diffracting the output beam, and the front surface of the reflective optic being an operative surface for reflecting the output beam. The mounting arm has first and second mounting surfaces. The front surface of the diffractive optic is mounted against the first mounting surface of the mounting arm, and the front surface of the reflective optic is mounted against the second mounting surface of the mounting arm for mounting the diffractive optic and the reflective optic for movement together with the mounting arm.

As so mounted, the first and second mounting surfaces preferably have a fixed relation to each other and a fixed relation to the mounting arm. Preferably, the first and second mounting surfaces are fixed parallel to each other. In a preferred form of the mounting arm, a common aperture is formed through the first and second mounting surfaces for conveying the output beam between the diffractive optic and the reflective optic. The common aperture extends beyond one side of the reflective optic to permit the output beam inside the external cavity to reach the diffractive optic, and the common aperture extends beyond one side of the diffractive optic to permit the output beam outside the external cavity to propagate past the diffractive optic.

An alignment system for an external cavity of a laser in accordance with the invention includes a laser mount for the laser, which emits a wavelength-tunable output beam from the external cavity, and a mounting arm carrying a diffractive optic for providing wavelength feedback to the laser. A pivot permits a range of relative rotations between the mounting arm and the laser mount about a pivot axis for varying the wavelength of feedback to the laser. An adjuster adjusts a relative angular orientation of the mounting arm with respect to the laser mount about an adjustment axis that is oblique to the pivot axis. The mounting arm has first and second junctures that are spaced apart along a length of the mounting arm on opposite sides of the diffractive optic. The first juncture is connected to the pivot for supporting the range of relative motions between the mounting arm and the laser mount about the pivot axis. The second juncture is connected to the adjuster for adjusting the relative angular orientation of the diffractive optic for aligning the wavelength feedback to the laser.

The adjuster is preferably a second of two adjusters, and the adjustment axis is preferably a second of two mutually oblique adjustment axes. The first of the two adjusters provides for adjusting the relative angular orientation of the mounting arm with respect to the laser mount about the first of the two mutually oblique adjustment axes. Preferably, the first adjuster is connected to the first juncture of the mounting arm for further adjusting the relative angular orientation of the diffractive optic for aligning the wavelength feedback to the laser.

The diffractive optic preferably has a planar surface with rulings, and the first and second adjusters provide for relatively adjusting the rulings substantially parallel to the pivot axis. The adjustments of the two adjusters can be made independently by orienting the oblique adjustment axes mutually orthogonal. The first adjuster preferably provides for relatively adjusting the rulings about the first adjustment axis in an orientation extending substantially perpendicular to the rulings, and the second adjuster preferably provides for relatively adjusting the rulings about the second adjustment axis in an orientation extending substantially normal to the planar surface of the diffractive optic.

An actuator pivots the mounting arm with respect to the laser mount about the pivot axis for varying the orientation of the diffractive optic with respect to the laser. The pivot is preferably formed by a flexural member that exerts a preload force on the actuator. The flexural member also preferably exerts a preload force on the second adjuster. The flexural member preferably has a plate-shaped body, and both the pivot axis and the second adjustment axis preferably lie substantially in a plane of the plate-shaped body of the flexural member. In addition, the flexural member preferably provides resistance to relative rotation between the mounting arm and the laser mount about the first adjustment axis that extends normal to the plane of the plate-shaped body of the flexural member. The preferred mounting arm has a home position for tuning the laser to a predetermined wavelength, and the flexural member exerts a preload force between the mounting arm and the actuator at the home position.

The alignment system also includes a base supporting both the laser mount and the adjuster. The second adjuster adjusts the second juncture of the mounting arm with respect to the base for varying the relative angular orientation of the diffractive optic with respect to the base. The second adjuster preferably includes a guideway that restricts motion of the mounting arm with respect to the laser mount in a direction parallel to the pivot axis while permitting motion of the mounting arm with respect to the laser mount in a plane normal to the pivot axis. The second adjuster also preferably provides for adjusting the guideway parallel to the pivot axis. The mounting arm is preferably preloaded against the guideway.

The actuator referred to above is preferably an electrical device such as a solenoid or an electric motor. Preferably, associated with the actuator are a position transducer and a position encoder for determining the position of actuator arm. A microprocessor responsive to commands from a computer system preferably controls the actuator for adjusting the wavelength output of the external cavity laser as required for its intended use. Generally, the external cavity contemplated for the invention has a Littrow configuration in which the first diffraction order is returned directly to the laser. However, the invention can also provide benefits for other cavity configurations. The descriptions of the invention are exemplary in nature for calling attention to specific forms of the invention to aid in its practice and understanding.

DRAWINGS

DETAILED DESCRIPTION

Figure 1:
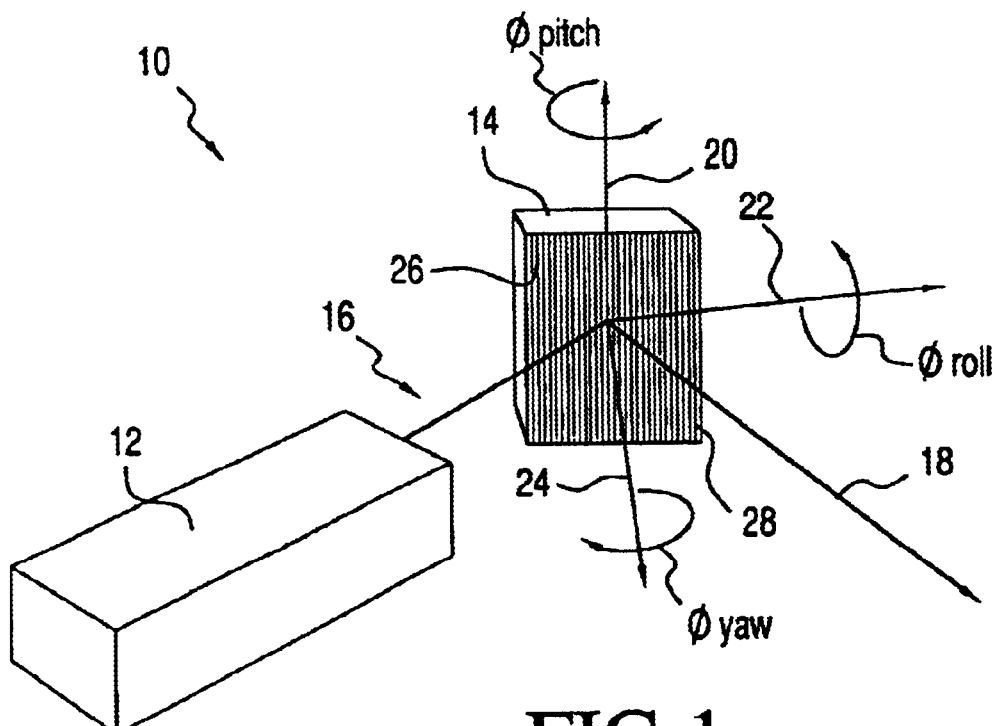
FIG. 1 is a perspective view, diagrammatically illustrating a tunable laser system having a laser and a diffractive optic and referencing the axes about which the diffractive optic is adjustable.
Figure 2:
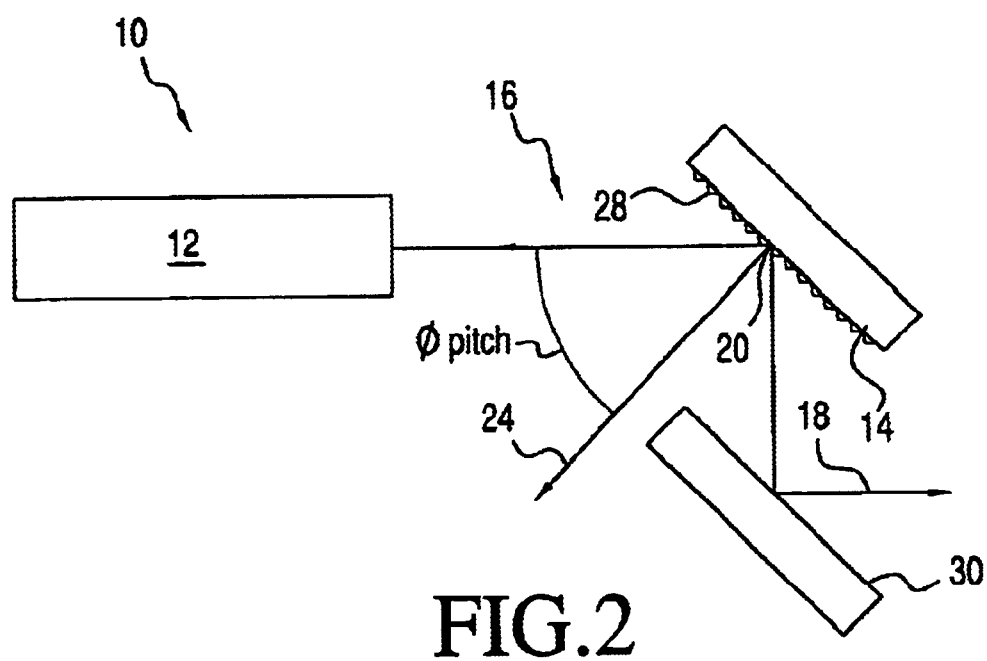
FIG. 2 is a plan view diagrammatically depicting a light path through an external cavity laser system in accordance with the invention showing a reflective optic in relation to the diffractive optic for maintaining a fixed orientation of a laser output beam.

As shown in FIGS. 1 and 2, a tunable laser system 10 includes a primary laser 12 coupled to a diffractive optic 14 in the form of a reflective diffraction grating at one end of an external cavity 16. The output beam 18 of the laser system 10 is wavelength tunable by rotating (i.e., pivoting) the diffractive optic 14 about a pitch axis 20 through a range of pitch angles $\phi_{pitch}$.

To carry out wavelength tuning, the diffractive optic 14 must be initially oriented properly, and the orientation must be maintained while the pitch angle $\phi_{pitch}$ is varied. For example, the diffractive optic 14 has rulings 26 that are formed in a reflective planar surface 28 and that extend parallel to the pitch axis 20. For achieving the proper initial orientation, the diffractive optic 14 is angularly adjustable about two oblique adjustment axes 22 and 24, which are preferably orthogonal to each other and to the pitch axis 20. The adjustment axis 22, which can be referred to as a "roll" axis, extends perpendicular to the rulings 26 in plane parallel to the planar surface 28 of the diffractive optic 14. The adjustment axis 24, which can be referred to as a "yaw" axis, extends normal to the planer surface 28 of the diffractive optic 14.

The angular orientation of the diffractive optic 14 about the three referenced axes 20, 22, and 24 are designated as $\phi_{pitch}$, $\phi_{roll}$, and $\phi_{yaw}$. Preferably, the diffractive optic 14 is oriented to a pitch angle $\phi_{pitch}$ near the so-called "Littrow angle" with values of the roll angle $\phi_{roll}$ and the yaw angle $\phi_{yaw}$ set to zero degrees (i.e., where the rulings 26 extend parallel to the pitch axis 20). The pitch angle $\phi_{pitch}$ is adjusted while maintaining the zero values for the roll and yaw angles $\phi_{roll}$ and $\phi_{yaw}$. The required alignment returns a first order diffracted portion of the output beam 18 to the primary laser 12 for tuning the laser 12 to a particular wavelength and advances a zero order diffracted portion of the output beam 18 beyond the external cavity 16 to a reflective optic 30, which can take the form of a folding mirror or prism.

In accordance with the illustrated embodiment of the invention, the diffractive optic 14 is mounted together with the reflective optic 30 on a rotatable mounting arm 32 shown in FIGS. 3–6. The reflective optic 30 is preferably mounted in a fixed orientation in the mounting arm 32 parallel to the diffractive optic 14. Both the diffractive optic 14 and the reflective optic 30 are preferably permanently affixed to the mounting arm 32 by an adhesive or other fastening system.

In one example, the primary laser 12 in the form of a laser diode has a collimated nominal output at 785 nanometers (nm), and the diffractive optic 14 in the form of a reflective diffraction grating has 1800 rulings (e.g., grooves) per millimeter (mm). Under these conditions, the nominal Littrow pitch angle is approximately 45 degrees. Thus, the mounting arm 32 could be initially oriented in a so-called "home" position at a pitch angle $\phi_{pitch}$ equal to approximately 45 degrees and at respective roll and yaw angles $\phi_{roll}$ and $\phi_{yaw}$ equal to zero degrees.

Figure 3:
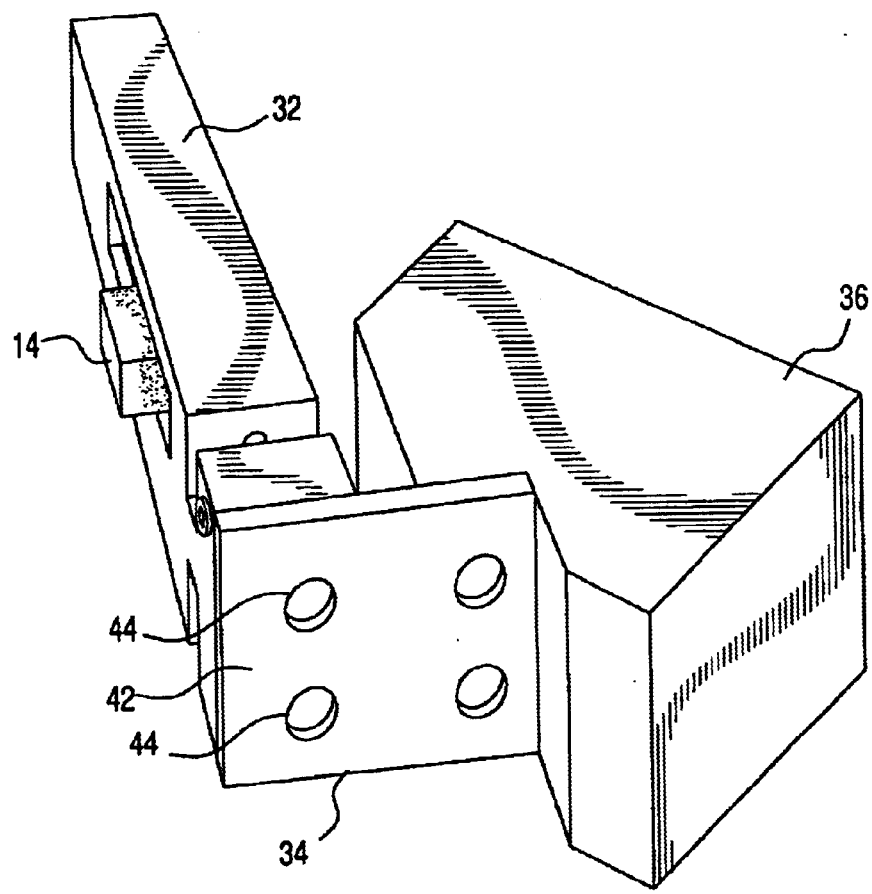
FIG. 3 is a perspective view of an assembly including a mounting arm for carrying both the diffractive optic and the reflective optic connected to a laser mount through a flexure member.
Figure 4:
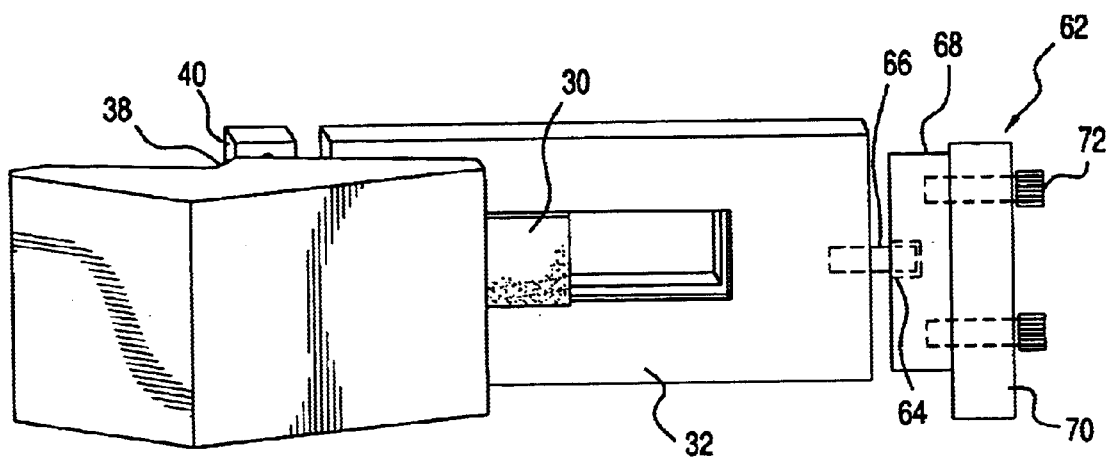
FIG. 4 is different perspective view of the assembly of FIG. 3 showing an adjustment mechanism at a remote end of the mounting arm.
Figure 5:
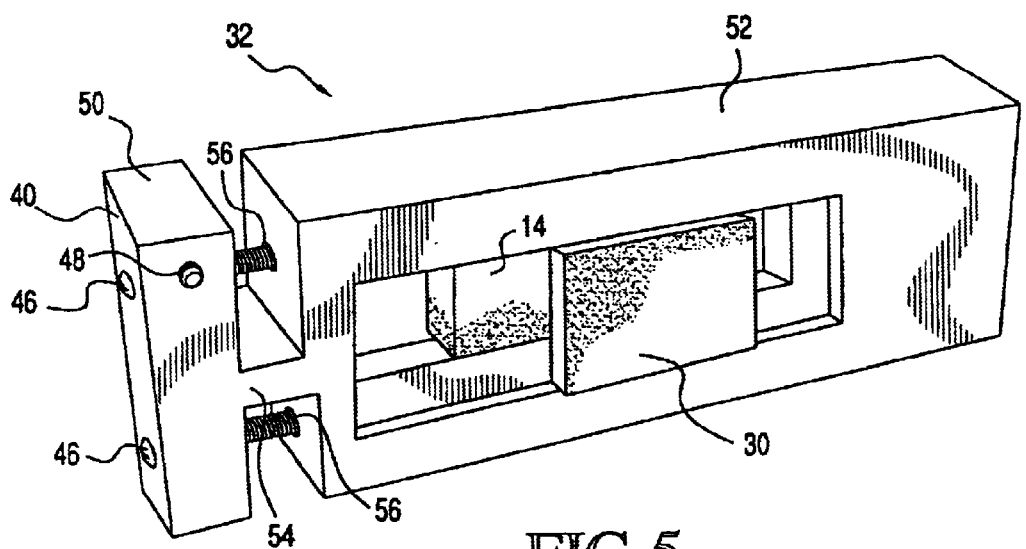
FIG. 5 is a perspective view of the mounting arm showing additional details.
Figure 6:
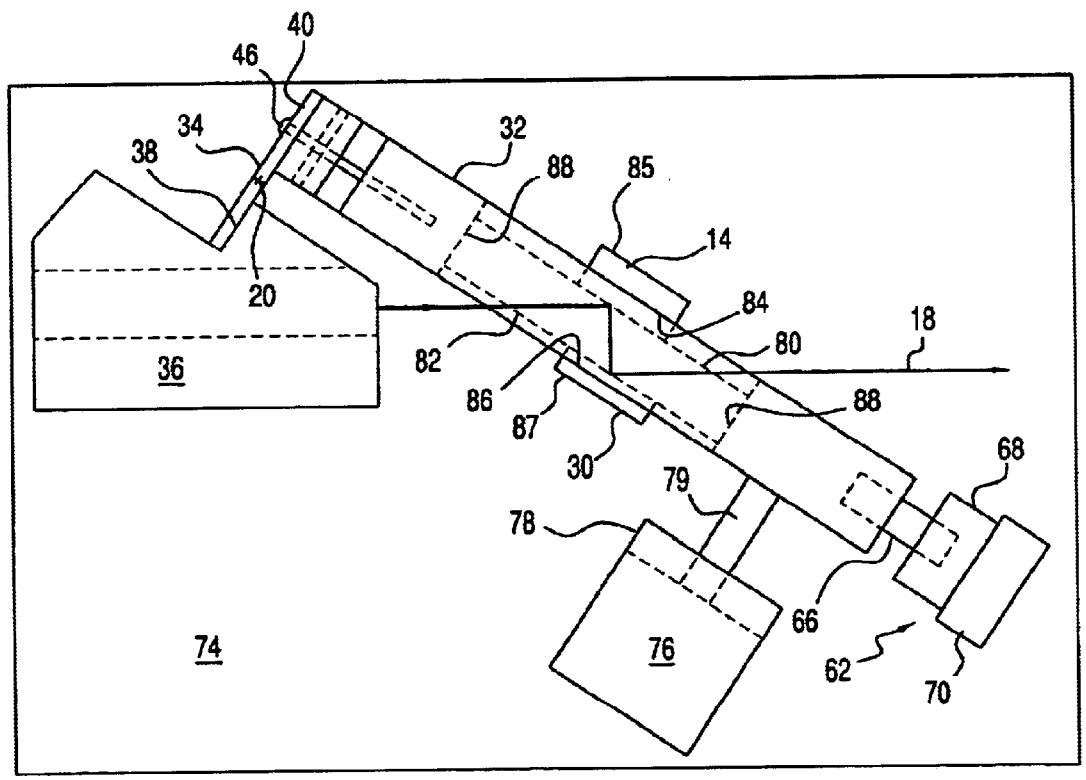
FIG. 6 is a plan view of the assembly mounted together with an actuator on a common base.

A flexure member 34 preferably attaches the mounting arm 32 to a laser mount 36, which mounts the primary laser 12. This flexure member 34 is resiliently flexible and can be constructed, for example, from sheet steel that is 0.01 inches thick. As shown in FIGS. 3, 4, and 6, the laser mount 36 is formed with a mounting surface 38 that is aligned with a mounting surface 40 at an end junction of the mounting arm 32 for attaching the flexure member 34 to both the mounting arm 32 and the laser mount 36.

Preferably, the flexure member 34 orients the diffractive optic 14 at respective roll and yaw angles $\phi_{roll}$ and $\phi_{yaw}$ equal to zero degrees. In practice, however, the mounting of the diffractive optic 14 may not be perfect. Thus, it is desirable to incorporate the ability to adjust the orientation of the mounting arm 32 in order to correct for any deviation in the initial roll and yaw angles $\phi_{roll}$ and $\phi_{yaw}$.

Precise adjustment of the roll angle $\phi_{roll}$ can be made by a roll angle adjuster 42 between the mounting arm 32 and the flexure member 34. The adjuster 42 includes oversized through-holes 44 in the flexure member 34 together with screws 46 that pass through these holes 42 into threaded engagements with the mounting arm 32. To adjust the roll angle $\phi_{roll}$, the screws 44 are set so that they are slightly loose. A set screw 48 in the mounting arm 32 is turned against the laser mount 36 for angularly adjusting the mounting arm 32 with respect to the laser mount 36 within the plane of the flexure member 34. The adjustment of the roll angle $\phi_{roll}$, is made while monitoring the position of the output beam 18. When the zero roll angle $\phi_{roll}$ position is identified, the screws 46 are tightened so that the mounting arm 32 is connected to the laser mount 36 at the zero roll angle $\phi_{roll}$ position of the diffractive optic 14. A similar roll angle $\phi_{roll}$ adjustment could be made between the flexure member 34 and the laser mount 36 or between angularly adjustable portions of the mounting arm 32.

The yaw angle $\phi_{yaw}$ of the diffractive optic 14 can also be adjusted in a variety of ways. For example, the mounting arm 32 is divided into two portions 50 and 52 separated by flexible portion 54. The screws 46 or others like them can be arranged to pass through the portion 50 of the mounting arm 32 into threaded openings 56 within the portion 52 of the mounting arm 32. The threaded openings 56 are located on opposite sides of the flexible portion 54 so that the two portions 50 and 52 of the mounting arm can be tilted with respect to each other by differentially tightening the screws 46. The flexible portion 54 is shaped and oriented so that the tilt between mounting portions 50 and 52 takes place about an adjustment axis parallel to the yaw reference axis 24.

Another way of adjusting the yaw angle $\phi_{yaw}$ of the diffractive optic 14 is by tilting the entire mounting arm 32 with respect to the laser mount 36 through the flexure member 34. An adjuster 62, which is shown in FIGS. 4 and 6, includes a guideway 64 that engages a pin 66 at a remote end junction of the mounting arm 32. The guideway 64 is formed in a slide 68 that is moveable on a guide mount 70 with respect to the laser mount 36. In fact, both the guide mount 70 and the laser mount 36 can be mounted together on a common base 74 as shown in FIG. 6.

The guide mount 70 permits adjustment of the slide 68 in the direction of the pitch pivot axis 20 via screws 72 extending through the guide mount 70 into threaded engagements with the slide 68. The pin 66 translates with the slide 68, twisting the flexure member 34 for tilting the mounting arm 32 about an adjustment axis parallel with the yaw reference axis 24. After reaching a zero yaw angle $\phi_{yaw}$ of the diffractive optic 14, the screws 72 are tightened to restrict further movement of the mounting arm 32 with respect to the laser mount 36 in a direction parallel to the pitch pivot axis 20. However, the guideway 64 permits movement of the mounting arm 32 with respect to the laser mount 36 in a plane normal to the pitch pivot axis 20. Although the pin 66 projects from the remote junction end of the mounting arm 32 and the guideway 64 is formed in the slide 68, the pin 66 could project from the slide 68 and the guideway 64 could be formed in the remote junction end of the mounting arm 32.

Once the initial alignment of the roll and yaw angles $\phi_{roll}$ and $\phi_{yaw}$ is accomplished and the alignment positions are fixed, an actuator 76 is used to push or pull the remote end of the mounting arm 32 about the pitch pivot axis 20 as defined by the flexural member 34 through a range of pitch angles $\phi_{pitch}$ to tune the laser wavelength. The laser can be calibrated so that the initial wavelength corresponds to the home position of the mounting arm 32.

Preferably, the actuator 76 is an electronically controlled actuator incorporating an electronically readable encoder 78 (a) to measure the output of a position transducer 79 for providing information concerning the position of the mounting arm 32 and (b) to indicate the laser system's operating wavelength. The geometry of the flexure member 34 can be selected to change the location of the pitch pivot axis 20 for the mounting arm 32. The pitch pivot axis 20 axis can be located remote from the diffractive optic 14 to provide for inclining as well as displacing the diffractive optic 14 to minimize the amount of mode-hopping exhibited by the laser 12 as the wavelength is tuned.

At the home position of the mounting arm 32 and actuator 76, the flexural member 34 is preferably (a) bent to exert a first preload torque on the mounting arm 32 about the pitch pivot axis 20 for imparting a preload force on the actuator 76 and (b) twisted to exert a second preload torque on the mounting arm 32 about the yaw adjustment axis 24 for imparting a preload force on the adjuster 62. Both preload forces are preferably maintained in their original directions throughout a range of pitch angles $\phi_{pitch}$ required to tune the laser wavelength to ensure more repeatable and robust tuning operations. For example, the first preload force preferably exerts a compressive force against the actuator 76 throughout the intended range of pitch angles $\phi_{pitch}$. Similarly, the second preload torque preferably maintains the pin 66 engaged with one side or the other of the guideway 64 throughout the range of adjustment positions about the yaw reference axis 24.

To maintain the laser output beam 18 exiting the external cavity 16 in the same angular orientation despite variations in the angular orientation of the diffractive optic 14 throughout the range of pitch angles $\phi_{pitch}$, the reflective optic 30 is mounted together with the diffractive optic 14 in a fixed parallel orientation on the mounting arm 32. Accurate mounting of the diffractive optic 14 and the reflective optic 30 is achieved in part by forming parallel mounting surfaces 80 and 82 in opposite sides of the mounting arm 32. The diffractive optic 14 includes front and back surfaces 84 and 85, and the reflective optic 30 includes front and back surfaces 86 and 87. The front surface 84 of the diffractive optic 14 is an operative surface for diffracting the output beam 18, and the front surface 86 of the reflective optic 30 is an operative surface for reflecting the output beam 18. The front surface 84 of the diffractive optic 14 is mounted against the parallel mounting surface 80 of the mounting arm 32, and the front surface 86 of the reflective optic 30 is mounted against the parallel mounting surface 82 of the mounting arm 32. By mounting the operative surfaces 84 and 86 of the diffractive optic 14 and the reflective optic 30 against the parallel mounting surfaces 80 and 82, a higher degree of accuracy is achieved. Mounting errors associated with differences between the front and back surfaces 84 and 85 or 86 and 87 of the diffractive optic 14 and the reflective optic 30 are avoided.

To permit the propagation of the output beam 18 through the mounting arm 32, a common aperture 88 is formed through the parallel mounting surfaces 80 and 82 for conveying the output beam 18 between the diffractive optic 14 and the reflective optic 30. The common aperture 88 extends beyond one side of the reflective optic 30 to permit the output beam 18 inside the external cavity 16 to reach the diffractive optic 14. The common aperture 88 extends beyond one side of the diffractive optic 14 to permit the output beam 18 outside the external cavity 16 to propagate past the diffractive optic 14 for its intended use.

Figure 7:
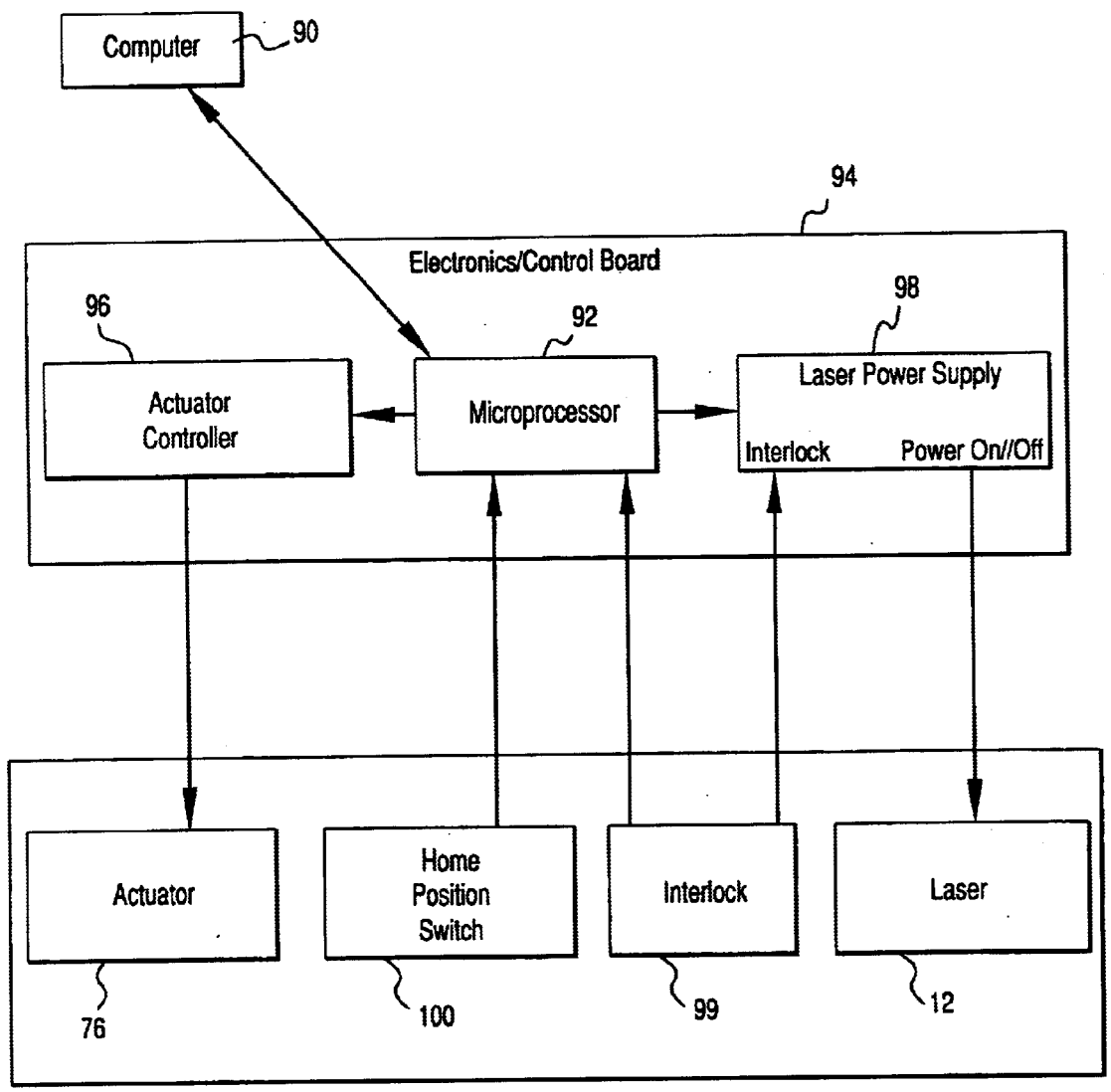
FIG. 7 is a block diagram showing the electrical/electronic components of the tunable laser system.

Referring to FIG. 7, laser tuning system 10 is shown having a computer 90 that controls a microprocessor 92 providing a computer controller on an electronics/control board 94. The control board 94 has an actuator controller 96 in which the wavelength selection or tuning data generated in the microprocessor 92 is applied and converted into an electrical signal which drives the actuator 76, the actuator being a DC motor, stepping motor, or another type of actuator. For example, the microprocessor 92 can send signal(s) to the actuator controller 96 to drive the actuator 76 forward or backward one or more steps. The actuator controller 96 then applies current or voltage signals to drive the actuator 76 accordingly.

A laser power supply 98 is electrically interlocked via a switch 99. This interlock is generally required as an emergency switch for laser safety. The microprocessor 92 also senses the state of the interlock and can report the status to the computer 90. A home position detection switch 100 detects when the mounting arm 32 is at the desired home position.

In operation, the computer 90 issues commands to the microprocessor 92. For example, such commands include: a) Turn laser power on (microprocessor enables laser)—microprocessor checks interlock status and reports the status to the computer; b) Turn laser power off (microprocessor disables laser); c) Move actuator forward by N steps to tune the laser 12 to a new wavelength that is separated from the previous wavelength by an amount proportional to N. This is done via actuator controller; d) Return actuator home—move actuator backward until home position switch is triggered.

The microprocessor 92 can operate in accordance with programming in the memory of the microprocessor 92, or in other memory (e.g., EEPROM, FLASH, or ROM) on the board 94. The computer 90 can represent a computer system, or a computer controller typical of tunable lasers, interfaced to the board 94. The interface between the computer 90 and the board 94 can use typical data communication (e.g., hardware, software, and cables) to communicate between a computer system and a microprocessor. The board 94 and the laser 12 can be located in a housing (not shown) having a window or port to output the laser beam 18. The computer 90 can be programmed to convert user selected or automatically selected wavelength or frequency into a number of actuator steps (with direction forward or backward) in a command to the microprocessor 92, in accordance with curves, look-up table, or formula in the memory of computer 90, to tune laser 12. The system can be calibrated at manufacture to associate different actuator positions to output characteristics of the laser (e.g., wavelength or frequency).

Variations and modifications in the described tunable laser system and alignment apparatus will undoubtedly suggest themselves to those skilled in the art. For example, a variety of angular and linear adjustment mechanisms could be used for making the prescribed adjustments along the adjustment axes 22 and 24. The adjustment axes themselves could be located in a variety of positions and other orientations for aligning the diffractive optic 14 with the laser output beam 18 and the pivot axis 20. Various manual or automatic adjustment mechanisms could be used to pivot the diffractive optic 14 about the pivot axis 20, and the location of the pivot axis 20 could be varied for such purposes as reducing mode hopping. Although the pivot axis 20 is preferably formed by a flexure member in the form of a resilient plate to provide a robust tuning system, other types of flexure members could be used as well as other types of pivot axes.

I claim:

1. A wavelength tuning system for adjusting the external cavity of a laser comprising:

a laser mount for supporting the laser, which emits a wavelength-tunable output beam from the external cavity;

a mounting arm supporting both a diffractive optic and a reflective optic in a fixed orientation with respect to each other;

a flexural member forming at least part of a connection between the mounting arm and the laser mount in a relative orientation for optically coupling the diffractive optic to the laser within the external cavity;

an actuator that pivots the mounting arm with respect to the laser mount about a pivot axis for varying a wavelength of a diffracted portion of the output beam returned to the laser without significantly varying an angular orientation of the output beam with respect to the laser mount as reflected from the reflective optic; and the flexural member supporting a limited rotation of the mounting arm with respect to the laser mount about the pivot axis while providing resistance to a similar limited rotation of the mounting arm with respect to the laser mount about an orthogonal rotational axis.

2. The tuning system of claim 1 further comprising an adjuster that adjusts the relative angular orientation of the mounting arm with respect to the laser mount about the orthogonal rotational axis.

3. The tuning system of claim 2 in which the adjuster includes an adjustable mounting for the flexural member that adjusts the mounting of the flexural member between the mounting arm and the laser mount about the orthogonal rotational axis.

4. The tuning system of claim 2 in which the orthogonal rotational axis is a first of two orthogonal rotational axes that are orthogonal to the pivot axis, the adjuster is a first of two adjusters that adjust the relative angular orientation of the mounting arm with respect to the laser mount, and a second of the adjusters adjusts the relative angular orientation of the mounting arm with respect to the laser mount about the second of the orthogonal rotational axes.

5. The tuning system of claim 4 in which the second adjuster includes an adjustment for the flexural member between the mounting arm and the laser mount about the second orthogonal rotational axis.

6. The tuning system of claim 4 in which the second adjuster includes an adjustment between two portions of the mounting arm, a first portion being connected to the flexural member and a second portion supporting both the diffractive optic and the reflective optic.

7. The tuning system of claim 4 in which the second adjuster engages the mounting arm remote from the flexural member for imparting a limited angular adjustment of the mounting arm about the second orthogonal rotational axis with respect to the laser mount through the flexural member.

8. The tuning system of claim 7 in which the mounting arm includes first and second ends, the first end being connected to the flexural member and a second end being connected to the second adjuster.

9. The tuning system of claim 8 in which the second adjuster permits motion of the mounting arm about the pivot axis while restricting further motion about the second orthogonal rotational axis from an established adjustment position.

10. The tuning system of claim 9 in which the flexural member exerts a first preload torque on the mounting arm about the pivot axis for imparting a preload force on the actuator and exerts a second preload torque on the mounting arm about the second orthogonal rotational axis for imparting a preload force on the second adjuster.

11. The tuning system of claim 4 in which the first and second adjusters provide for adjusting the diffractive optic to return the diffracted portion of the output beam to the laser along a path of retroreflection.

12. The tuning system of claim 4 in which the diffractive optic has a planar surface with rulings, and the first and second adjusters provide for relatively adjusting the rulings substantially parallel to the pivot axis.

13. The tuning system of claim 12 in which the first adjuster provides for relatively adjusting the rulings about the first orthogonal rotational axis in an orientation extending substantially perpendicular to the rulings, and the second adjuster provides for relatively adjusting the rulings about the second orthogonal rotational axis in an orientation extending substantially normal to the planar surface of the diffractive optic.

14. The tuning system of claim 1 in which both the diffractive optic and the reflective optic include front and back surfaces, the front surface of the diffractive optic being an operative surface for diffracting the output beam and the front surface of the reflective optic being an operative surface for reflecting the output beam.

15. The tuning system of claim 14 in which the mounting arm includes first and second mounting surfaces and the front surface of the diffractive optic being mounted against the first mounting surface and the front surface of the reflective optic being mounted against the second mounting surface.

16. The tuning system of claim 15 in which the first and second mounting surfaces have a fixed relation to each other and a fixed relation to the mounting arm.

17. The tuning system of claim 16 in which a common aperture is formed in the first and second mounting surfaces for conveying the output beam between the diffractive optic and the reflective optic.

18. The tuning system of claim 17 in which the common aperture extends beyond one side of the reflective optic to permit the output beam inside the external cavity to reach the diffractive optic and extends beyond one side of the diffractive optic to permit the output beam outside the external cavity to propagate past the diffractive optic.

19. The tuning system of claim 1 in which the flexural member is mounted between nominally parallel mounting surfaces of the mounting arm and the laser mount.

20. The tuning system of claim 19 in which the pivot axis extends parallel to the nominally parallel mounting surfaces of the mounting arm and the laser mount.

21. The tuning system of claim 1 in which the flexural member has a plate-shaped body, and the pivot axis is defined by bending of the plate-shaped body.

22. The tuning system of claim 21 in which the plate-shaped body of the flexural member is made of a resilient material.

23. The tuning system of claim 21 in which the pivot axis lies in a space between the laser mount and the mounting arm.

24. The tuning system of claim 23 further comprising a first fastening system that connects the plate-shaped body of the flexural member to the laser mount and a second fastening system that connects the plate-shaped body of the flexural member to the mounting arm.

25. The tuning system of claim 24 in which one of the first and second fastening systems is adjustable for adjusting the relative angular orientation of the mounting arm with respect to the laser mount about the orthogonal rotational axis.

26. The tuning system of claim 25 in which the pivot axis extends substantially parallel to a plane of the plate-shaped body of the flexural member and the orthogonal rotational axis extends normal to the plane of the plate-shaped body of the flexural member.

27. An adjustable external cavity arrangement for a wavelength tunable laser comprising:
a laser mount for supporting the wavelength tunable laser that emits an output beam whose peak wavelength is adjustable by wavelength feedback within the external cavity;
a mounting arm supporting both a diffractive optic and a reflective optic for movement with the mounting arm;
a pivot supporting relative rotation between the laser mount and the mounting arm for orienting the diffractive optic with respect to the laser through a range of pitch angles;
the diffractive optic being movable with respect to the laser through the range of pitch angles for providing feedback to the laser as a corresponding range of wavelengths;
the reflective optic being movable together with the diffractive optic for maintaining a substantially fixed angular orientation of the output beam with respect to the laser mount as reflected from the reflective optic;
the diffractive optic and the reflective optic including front and back surfaces, the front surface of the diffractive optic being an operative surface for diffracting the output beam and the front surface of the reflective optic being an operative surface for reflecting the output beam;
the mounting arm including first and second mounting surfaces; and
the front surface of the diffractive optic being mounted against the first mounting surface of the mounting arm and the front surface of the reflective optic being mounted against the second mounting surface of the mounting arm for mounting the diffractive optic and the reflective optic for movement together with the mounting arm.

28. The external cavity arrangement of claim 27 in which the first and second mounting surfaces have a fixed relation to each other and a fixed relation to the mounting arm.

29. The external cavity arrangement of claim 28 in which the first and second mounting surfaces are parallel to each other.

30. The external cavity arrangement of claim 27 in which a common aperture is formed through the first and second mounting surfaces for conveying the output beam between the diffractive optic and the reflective optic.

31. The external cavity arrangement of claim 30 in which the common aperture extends beyond one side of the reflective optic to permit the output beam inside the external cavity to reach the diffractive optic, and the common aperture extends beyond one side of the diffractive optic to permit the output beam outside the external cavity to propagate past the diffractive optic.

32. The external cavity arrangement of claim 27 further comprising an actuator that pivots the mounting arm with respect to the laser mount about the pivot axis for varying the orientation of the diffractive optic with respect to the laser through the range of pitch angles for providing feedback to the laser through range of wavelengths.

33. The external cavity arrangement of claim 32 further comprising an adjuster that adjusts a relative angular orientation of the mounting arm with respect to the laser mount about an adjustment axis that is oblique to the pivot axis.

34. The external cavity arrangement of claim 33 in which the pivot includes a flexural member that exerts a preload torque about the pivot axis on the actuator.

35. The external cavity arrangement of claim 34 in which the flexural member exerts a preload torque about the adjustment axis on the adjuster.

36. The external cavity arrangement of claim 35 in which the flexural member has a plate-shaped body and both the pivot axis and the adjustment axis lie substantially in a plane of the plate-shaped body of the flexural member.

37. The external cavity arrangement of claim 34 in which both the flexural member and the diffractive optic have planar surfaces and the planar surface of the diffractive optic is oriented perpendicular to the planar surface of the flexural member.

38. An alignment system for an external cavity of a laser comprising:
a laser mount for the laser, which emits a wavelength-tunable output beam from the external cavity;
a mounting arm carrying a diffractive optic for providing wavelength feedback to the laser;
a pivot permitting a range of relative rotations between the mounting arm and the laser mount about a pivot axis for varying the wavelength of feedback to the laser;
an adjuster that adjusts a relative angular orientation of the mounting arm with respect to the laser mount about an adjustment axis that is oblique to the pivot axis;
the mounting arm having first and second junctures that are spaced apart along a length of the mounting arm on opposite sides of the diffractive optic;
the first juncture being connected to the pivot for supporting the range of relative motions between the mounting arm and the laser mount about the pivot axis; and
the second juncture being connected to the adjuster for adjusting the relative angular orientation of the diffractive optic for aligning the wavelength feedback to the laser.

39. The alignment system of claim 38 in which the adjuster is a second of two adjusters, the adjustment axis is a second of two mutually oblique adjustment axes, and a first of the two adjusters provides for adjusting the relative angular orientation of the mounting arm with respect to the laser mount about a first of the two mutually oblique adjustment axes.

40. The alignment system of claim 39 in which the first adjuster is connected to the first juncture of the mounting arm for further adjusting the relative angular orientation of the diffractive optic for aligning the wavelength feedback to the laser.

41. The alignment system of claim 40 in which the oblique adjustment axes are mutually orthogonal.

42. The alignment system of claim 39 in which the diffractive optic has a planar surface with rulings, and the first and second adjusters provide for relatively adjusting the rulings substantially parallel to the pivot axis.

43. The alignment system of claim 42 in which the first adjuster provides for relatively adjusting the rulings about the first adjustment axis in an orientation extending substantially perpendicular to the rulings, and the second adjuster provides for relatively adjusting the rulings about the second adjustment axis in an orientation extending substantially normal to the planar surface of the diffractive optic.

44. The alignment system of claim 38 further comprising an actuator that pivots the mounting arm with respect to the laser mount about the pivot axis for varying the orientation of the diffractive optic with respect to the laser through the range of pitch angles for varying the wavelength of feedback to the laser.

45. The alignment system of claim 44 in which the pivot includes a flexural member that exerts a preload force on the actuator.

46. The alignment system of claim 45 in which the flexural member also exerts a preload force on the adjuster.

47. The alignment system of claim 46 in which the flexural member has a plate-shaped body and both the pivot axis and the adjustment axis lie substantially in a plane of the plate-shaped body of the flexural member.

48. The alignment system of claim 47 in which the flexural member provides resistance to relative rotation between the mounting arm and the laser mount about an axis that extends normal to the plane of the plate-shaped body of the flexural member.

49. The alignment system of claim 44 in which the mounting arm has a home position for tuning the laser to a predetermined wavelength, and the flexural member exerts a preload force between the mounting arm and the actuator at the home position.

50. The alignment system of claim 38 in which the diffractive optic diffracts a portion of the output beam to provide wavelength feedback to the laser.

51. The alignment system of claim 50 further comprising a reflective optic that is movable together with the diffractive optic for maintaining a substantially fixed angular orientation of the output beam with respect to the laser mount as reflected from the reflective optic.

52. The alignment system of claim 51 in which the mounting arm supports both the diffractive optic and the reflective optic for movement with the mounting arm.

53. The alignment system of claim 38 further comprising a base supporting both the laser mount and the adjuster.

54. The alignment system of claim 53 in which the adjuster adjusts the second juncture of the mounting arm with respect to the base for varying the relative angular orientation of the diffractive optic with respect to the base.

55. The alignment system of claim 38 in which the adjuster includes a guideway that restricts motion of the mounting arm with respect to the laser mount in a direction parallel to the pivot axis while permitting motion of the mounting arm with respect to the laser mount in a plane normal to the pivot axis.

56. The alignment system of claim 55 in which the adjuster provides for adjusting the guideway parallel to the pivot axis.

57. The alignment system of claim 56 in which the mounting arm is preloaded against the guideway.

* * * * *